United States Patent
Itoh et al.

(10) Patent No.: US 7,709,841 B2
(45) Date of Patent: May 4, 2010

(54) THIN FILM TRANSISTOR HAVING AN ISLAND LIKE SEMICONDUCTOR LAYER ON AN INSULATOR

(75) Inventors: Yasuyoshi Itoh, Tokyo (JP); Toru Takeguchi, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 4 days.

(21) Appl. No.: 11/420,956

(22) Filed: May 30, 2006

(65) Prior Publication Data

US 2007/0034871 A1    Feb. 15, 2007

(30) Foreign Application Priority Data

Aug. 10, 2005   (JP) .............................. 2005-231600

(51) Int. Cl.
   *H01L 29/04* (2006.01)
(52) U.S. Cl. .............................. 257/59; 257/72; 438/149
(58) Field of Classification Search .................. 257/2, 257/16, 49, 52, 57, 59, 66, 72; 136/285
   See application file for complete search history.

(56) References Cited

U.S. PATENT DOCUMENTS

| | | | |
|---|---|---|---|
| 5,879,973 A * | 3/1999 | Yanai et al. ................. | 438/161 |
| 6,160,288 A * | 12/2000 | Yamada ....................... | 257/330 |
| 6,403,421 B1 * | 6/2002 | Ikeda et al. ................. | 438/267 |
| 2001/0030367 A1 * | 10/2001 | Noguchi et al. ............ | 257/758 |
| 2002/0006681 A1 * | 1/2002 | Yamanaka et al. .......... | 438/29 |
| 2002/0038998 A1 * | 4/2002 | Fujita et al. ................ | 313/495 |
| 2003/0013304 A1 * | 1/2003 | Deliwala ..................... | 438/689 |
| 2003/0151049 A1 * | 8/2003 | Hotta et al. .................. | 257/59 |
| 2003/0222319 A1 * | 12/2003 | Azuma ........................ | 257/408 |
| 2004/0008314 A1 * | 1/2004 | Hayashi et al. ............. | 349/158 |
| 2004/0051180 A1 * | 3/2004 | Kado et al. .................. | 257/774 |
| 2004/0198019 A1 * | 10/2004 | Yasui et al. ................. | 438/435 |
| 2004/0219721 A1 * | 11/2004 | Shiraishi et al. ............ | 438/149 |
| 2004/0262606 A1 * | 12/2004 | Teramoto ..................... | 257/59 |

FOREIGN PATENT DOCUMENTS

| | | |
|---|---|---|
| JP | 2000-77665 | 3/2000 |
| JP | 2000-332254 | 11/2000 |
| JP | 2003-203925 | 7/2003 |
| JP | 2003-258262 | 9/2003 |
| JP | 2004-64060 | 2/2004 |
| KR | 1998-071105 | 10/1998 |

* cited by examiner

*Primary Examiner*—Lynne A Gurley
*Assistant Examiner*—Vernon P Webb
(74) *Attorney, Agent, or Firm*—Oblon, Spivak, McClelland, Maier & Neustadt, L.L.P.

(57) ABSTRACT

An island-like semiconductor layer is formed on a main surface of an insulating substrate. A side wall of the island-like semiconductor layer is made substantially perpendicular to the insulating substrate. An insulating film is formed along the side wall of the semiconductor layer. The insulating film is formed to include a slanted face and have a sectional shape in which a width measured from the side wall of the semiconductor layer decreases as a distance to a bottom increases. A gate insulating film can be formed on the semiconductor layer with good step coverage because of inclusion of the insulating film, to preclude a possibility of causing disconnection of a gate electrode. Also, a thickness of a portion of the semiconductor layer in which a channel region is formed is uniform, to obtain stable transistor characteristics.

3 Claims, 5 Drawing Sheets

THIN FILM TRANSISTOR HAVING AN ISLAND LIKE SEMICONDUCTOR LAYER ON AN INSULATOR

BACKGROUND OF THE INVENTION

1. Field of the Invention

The present invention relates to a thin film transistor used in a liquid crystal display device or a display device which utilizes organic electro-luminescence, and to a method of manufacturing the thin film transistor.

2. Description of the Background Art

A thin film transistor (TFT) used in a liquid crystal display device or a display device which utilizes organic electro-luminescence has a structure in which a gate insulating film is formed on an island-like semiconductor layer and a gate electrode is formed on the gate insulating film.

More specifically, the gate insulating film is formed to be shaped like eaves in section thereof because of poor step coverage of the gate insulating film over a stepped portion of the semiconductor layer.

Then, to form the gate electrode on the gate insulating film by carrying out dry etching on the gate electrode would cause a portion of the gate electrode which is present under eaves formed of the gate insulating film to remain un-etched as a residue. Such residue is likely to be short-circuited to an adjacent wire.

On the other hand, to form the gate electrode on the gate insulating film by carrying out wet etching on the gate electrode would cause an etchant to run through a back side of the gate electrode around the stepped portion of the semiconductor layer. As a result, etching on the gate electrode proceeds from both a front side and a back side thereof, to cause a problem of disconnection of the gate electrode.

To solve the above-noted problems, according to the invention described in Japanese Patent Application Laid-Open No. 2004-64060 (which will hereinafter be referred to as "JP No. 2004-64060), a semiconductor layer is tapered with a width thereof decreasing as a distance from a bottom increases. In JP No. 2004-64060, by tapering the semiconductor layer, step coverage of a gate insulating film is improved, to thereby suppress a residue of a gate electrode formed on the gate insulating film, and alleviate the problem of disconnection of the gate electrode.

According to the invention described in Japanese Patent Application Laid-Open No. 2000-77665 (which will hereinafter be referred to as "JP No. 2000-77665"), a semiconductor layer is tapered and Ar or the like is implanted into a tapered portion of the semiconductor layer.

According to the invention described in Japanese Patent Application Laid-Open No. 2000-332254 (which will hereinafter be referred to as "JP No. 2000-332254"), a semiconductor layer is tapered, and Ar or the like is implanted into a tapered portion of the semiconductor layer. Further, an oxide film is subsequently formed.

According to the invention described in Japanese Patent Application Laid-Open No. 2003-258262 (which will hereinafter be referred to as "JP No. 2003-258262"), a semiconductor layer is tapered, and impurities of the same conductivity type as a channel are implanted into a tapered portion of the semiconductor layer at a dose which is two to five times a dose of impurities contained in the channel.

In a thin film transistor described in JP No. 2004-64060, however, a channel is formed in a thin portion of the tapered semiconductor layer at a low gate voltage, to turn on the corresponding portion. Namely, the thin portion of the semiconductor layer is turned on in advance of a portion of the semiconductor layer in which a principal part of the channel is formed.

Accordingly, a hump is likely to occur in a line indicating so-called subthreshold characteristics (Ig-Vg characteristics). As a result, it becomes difficult to control a threshold voltage (Vth), to make electrical characteristics of the transistor unstable.

Further, a leakage current is likely to flow between a source and a drain in the tapered portion of the semiconductor layer, to degrade the electrical characteristics of the TFT.

On the other hand, in the invention described in JP No. 2000-332254, the tapered portion of the semiconductor layer is oxidized. Accordingly, the semiconductor layer expands so that the volume thereof increases to approximately twice the original volume thereof. Hence, an additional stepped portion is formed in a side wall of the semiconductor layer, to cause troubles in forming a gate electrode.

Also, in the invention described in JP No. 2000-77665 or JP No. 2003-258262, etching is carried out on a resist while tapering the resist in order to taper the semiconductor layer. As such, it is difficult to control a width of an upper portion (i.e., channel width) of the semiconductor layer.

SUMMARY OF THE INVENTION

It is an object of the present invention to provide a thin film transistor having excellent electrical characteristics without causing disconnection of a gate electrode which occurs due to poor step coverage of a gate insulating film over a stepped portion of an island-like semiconductor layer.

According to a first aspect of the present invention, a thin film transistor includes a semiconductor layer, a gate insulating film, and a gate electrode. The semiconductor layer is formed like an island on an insulating substrate. The gate insulating film is formed on the semiconductor layer. The gate electrode is formed on the gate insulating film. The thin film transistor further includes an insulating film formed along a side wall of the semiconductor layer. The insulating film is formed to include a slanted face and to have a sectional shape in which a width measured from the side wall of the semiconductor layer decreases as a distance to a bottom increases.

The insulating film is formed along the side wall of the semiconductor layer. The insulating film is formed to include a slanted face and have a sectional shape in which a width measured from the side wall of the semiconductor layer decreases as a distance to a bottom increases. Because of inclusion of the insulating film, no stepped portion is formed in the side wall of the semiconductor layer, so that the gate insulating film can be formed on the semiconductor layer with good step coverage. As a result, it is possible to form a thin film transistor with excellent electric characteristics without causing disconnection of the gate electrode or a residue.

According to a second aspect of the present invention, a thin film transistor includes a semiconductor layer, a gate insulating film, and a gate electrode. The semiconductor layer is formed like an island on an insulating substrate. The gate insulating film is formed on the semiconductor layer. The gate electrode is formed on the gate insulating film. The thin film transistor further includes an insulating film formed to fill a trench in the gate insulating film, which trench is formed due to a stepped portion in a side wall of the semiconductor layer.

Because of inclusion of the insulating film formed to fill the trench in the gate insulating film, which trench is formed due to a stepped portion in the side wall of the semiconductor layer, an upper portion of the gate insulating film is smooth.

As a result, it is possible to form the gate electrode on the gate insulating film without causing disconnection. Also, there is no need of tapering the semiconductor layer, so that the semiconductor layer is formed with a uniform thickness. As the semiconductor layer does not include a portion thinner than the other portions, it is possible to obtain a thin film transistor with excellent electric characteristics indicated by a line free from a hump.

According to a third aspect of the present invention, a method of manufacturing a thin film transistor includes the following steps (a) and (b). The step (a) is to form an island-like semiconductor layer on an insulating substrate. The step (b) is to spin coat an insulating film onto the insulating substrate, to form the insulating film on a side wall of the semiconductor layer such that the insulating film includes a slanted face and has a sectional shape in which a width measured from the side wall of the semiconductor layer decreases as a distance to a bottom increases.

The insulating film is formed along the side wall of the semiconductor layer. The insulating film is formed to include a slanted face and have a sectional shape in which a width measured from the side wall of the semiconductor layer decreases as a distance to a bottom increases. Because of inclusion of the insulating film, no stepped portion is formed in the side wall of the semiconductor layer, so that the gate insulating film can be formed on the semiconductor layer with good step coverage. As a result, it is possible to form a thin film transistor with excellent electric characteristics without causing disconnection of the gate electrode or residues.

According to a fourth aspect of the present invention, a method of manufacturing a thin film transistor includes the following steps (a), (b), and (c). The step (a) is to form an island-like semiconductor layer on an insulating substrate. The step (b) is to form a gate insulating film which covers the semiconductor layer. The step (c) is to spin coat an insulating film onto the gate insulating film, to form the insulating film which fills a trench in the gate insulating film, which trench is formed due to a stepped portion in a side wall of the semiconductor layer.

Because of inclusion of the insulating film formed to fill the trench in the gate insulating film, which trench is formed due to a stepped portion in the side wall of the semiconductor layer, an upper portion of the gate insulating film is smooth. As a result, it is possible to form the gate electrode on the gate insulating film without causing disconnection. Also, there is no need of tapering the semiconductor layer, so that the semiconductor layer is formed with a uniform thickness. As the semiconductor layer does not include a portion thinner than the other portions, it is possible to obtain a thin film transistor with excellent electric characteristics indicated by a line free from a hump.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

A. Structure

Figure 1:
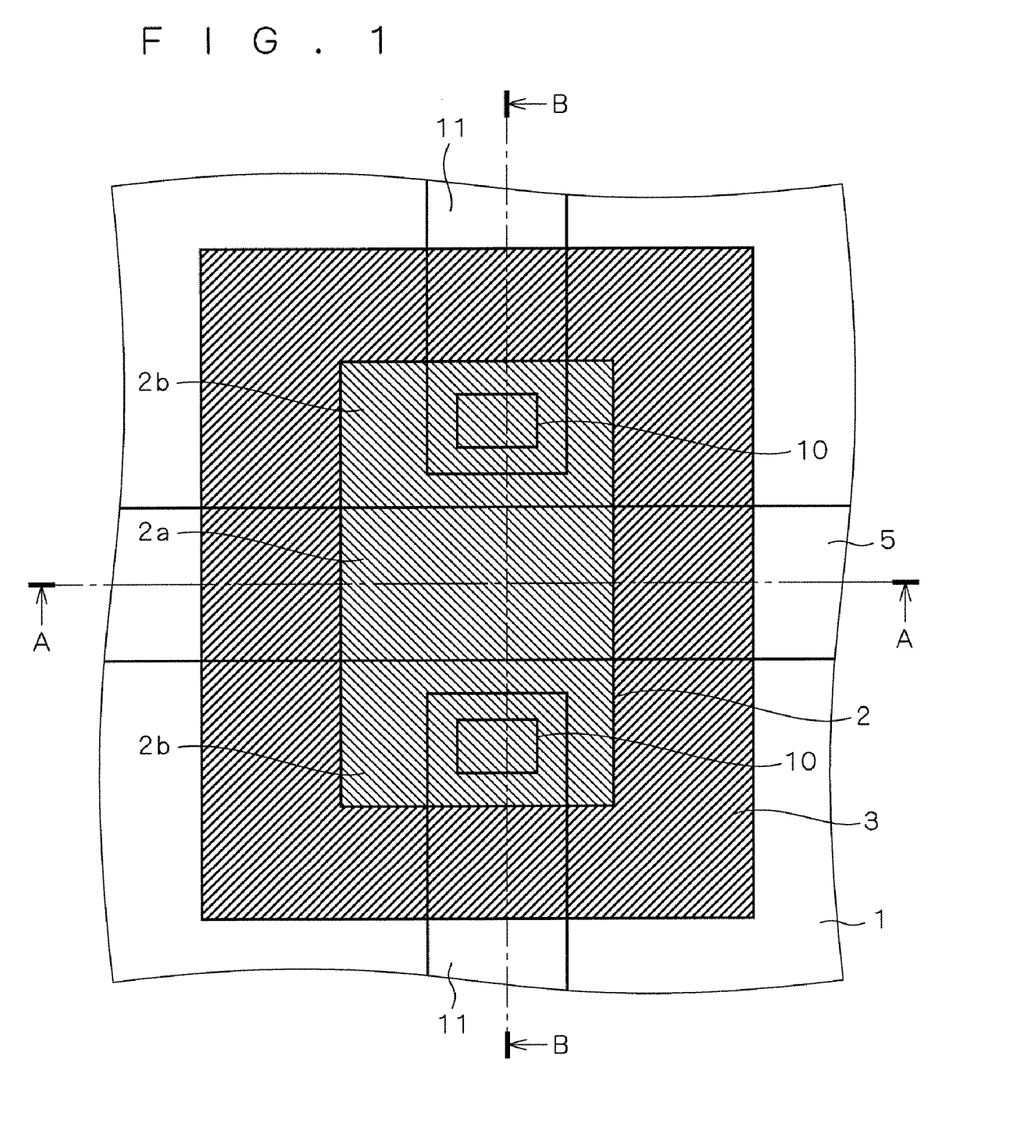
FIG. 1 is a plan view illustrating a structure of a principal part of a thin film transistor according to a first preferred embodiment.
Figure 2:
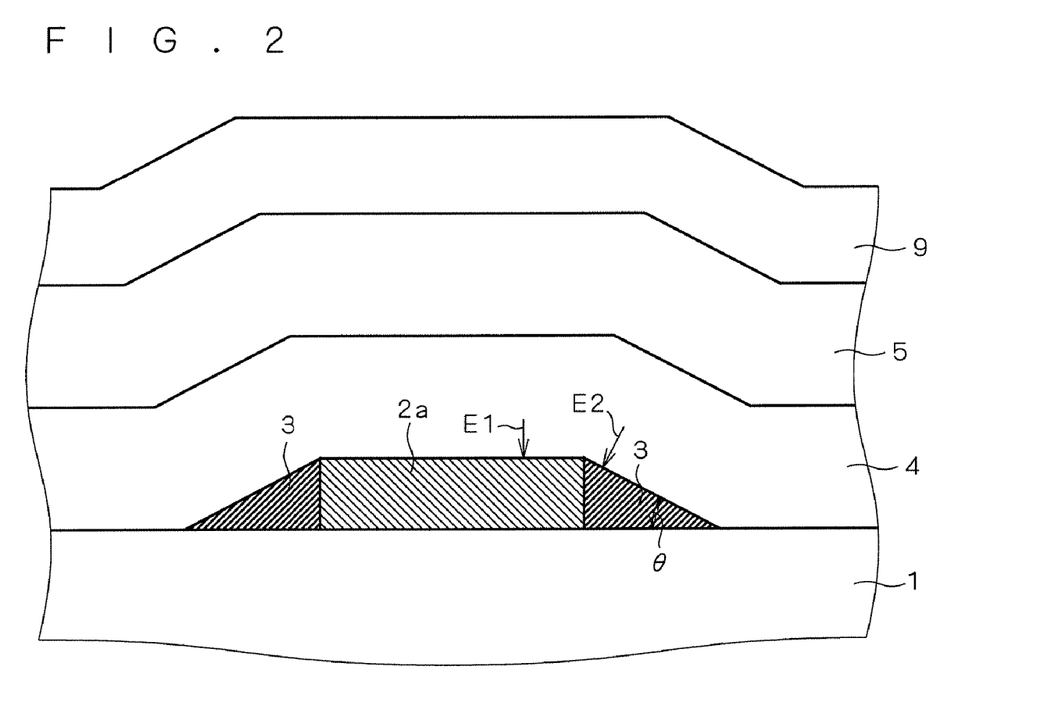
FIG. 2 is a sectional view illustrating the structure of the principal part of the thin film transistor according to the first preferred embodiment.
Figure 3:
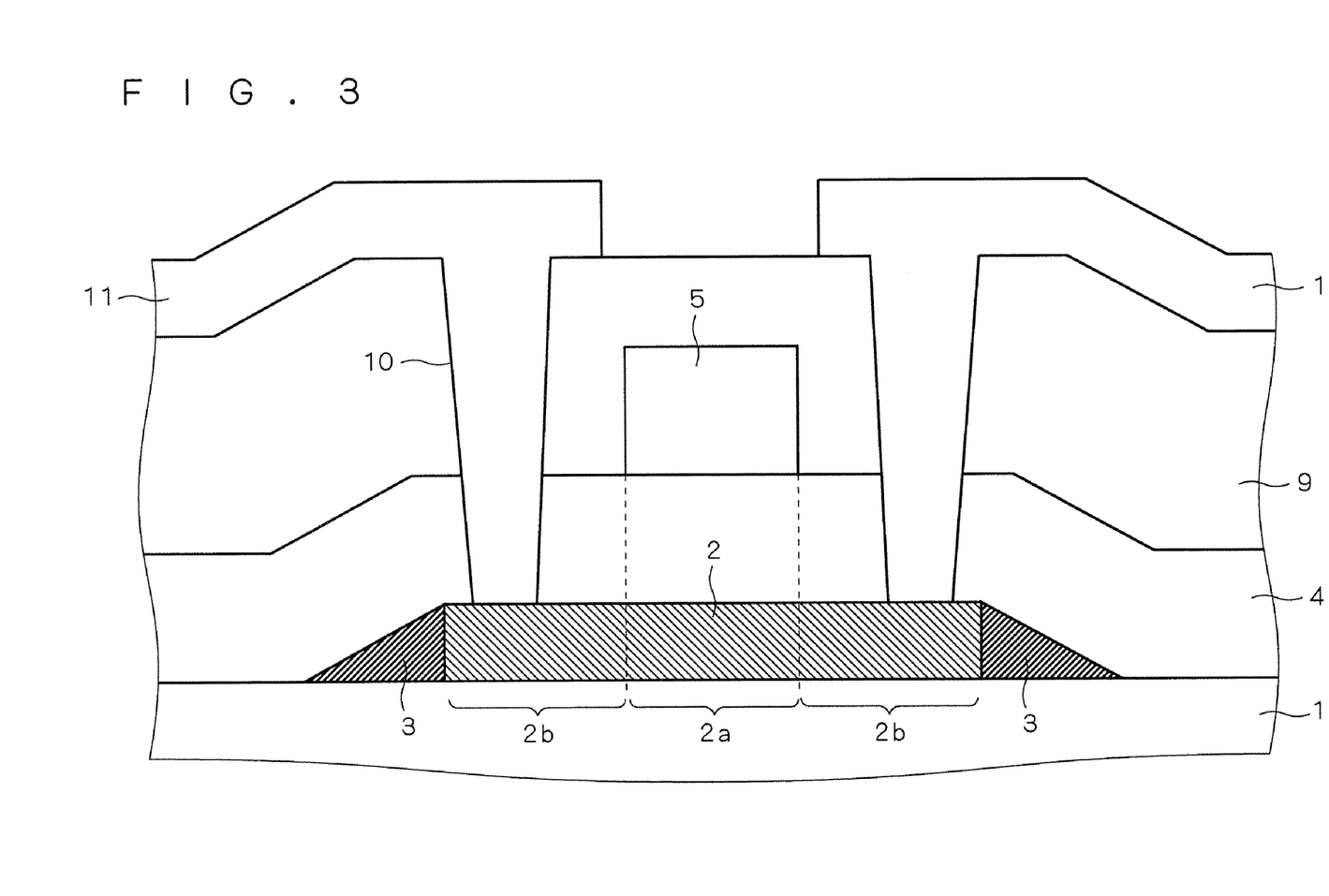
FIG. 3 is another sectional view illustrating the structure of the thin film transistor according to the first preferred embodiment.

FIG. 1 is a plan view illustrating a structure of a principal part of a thin film transistor according to a first preferred embodiment. FIG. 2 is a sectional view illustrating the structure of the principal part of the thin film transistor according to the first preferred embodiment. FIG. 3 is another sectional view illustrating the structure of the thin film transistor according to the first preferred embodiment. It is noted that the sectional view of FIG. 2 is taken along a line A-A in FIG. 1 and the sectional view of FIG. 3 is taken along a line B-B in FIG. 1.

A semiconductor layer 2 which includes a channel region 2a and source/drain regions 2b containing impurities such as phosphorus and boron is formed like an island on an insulating substrate 1 such as a glass substrate. A side wall of the semiconductor layer 2 is substantially perpendicular to the insulating substrate 1. A material for forming the semiconductor layer 2 is either amorphous silicon or polycrystalline silicon. It is noted that although a rectangle which is a simple shape is employed as a shape of the island-like semiconductor layer 2 in plan view in the first preferred embodiment for the purposes of explanation, various shapes can be employed depending on design requirements in practical applications.

An insulating film 3 which is tapered and includes a spin-on-glass (SOG) film, for example, is formed on the side wall of the semiconductor layer 2. More specifically, the insulating film 3 is formed to include a slanted face and to have a sectional shape in which a width measured from the side wall of the semiconductor layer 2 decreases as a distance to a bottom increases.

An angle θ between the slanted face of the insulating film 3 and the insulating substrate 1 is preferably in a range from 10 to 45 degrees. It has been experimentally confirmed that step coverage of a gate insulating film 4 formed on the insulating film 3 is particularly good when the insulating film 3 is formed to include a face slanted at an angle in the above-noted range with respect to the insulating substrate 1.

Also, the insulating film 3 is formed along the side wall of the semiconductor layer 2 to surround the semiconductor layer 2 as viewed from the above (refer to FIG. 1).

The gate insulating film 4 is formed to cover the semiconductor layer 2 and the insulating film 3. A gate electrode 5 is formed on the gate insulating film 4. The gate electrode 5 is formed to overlap most of the channel region 2a in vertical direction with the gate insulating film 4 interposed therebetween. An interlayer insulating film 9 is formed to cover the insulating film 3 and the gate electrode 5. A contact hole 10 passes through the gate insulating film 4 and the interlayer insulating film 9. A signal line 11 formed on the interlayer insulating film 9 is connected to the source/drain regions 2b via the contact hole 10.

B. Manufacturing Method

Next, a method of manufacturing the thin film transistor according to the first preferred embodiment will be described. First, a semiconductor film (not illustrated) is formed on an entire surface of the insulating substrate 1.

Secondly, etching is carried out on the semiconductor film, to form the island-like semiconductor layer 2. For this etching, conditions for the etching are optimized so as to make the side wall of the semiconductor layer 2 substantially perpendicular to the insulating substrate 1.

Subsequently, an SOG film is spin coated onto the insulating substrate 1. Thereafter, heat treatment is carried out, so that the insulating film 3 which is tapered is formed on the side wall of the semiconductor layer 2.

Then, the gate insulating film 4 is formed on the insulating substrate 1 by a CVD process, a sputtering process, or the like.

At that time, no stepped portion is provided in the side wall of the semiconductor layer 2 because the insulating film 3 is formed on the side wall of the semiconductor layer 2. Accordingly, the gate insulating film 4 can be deposited on the semiconductor layer 2 with good step coverage.

After the gate insulating film 4 is formed, a metal film (not illustrated) is formed on the gate insulating film 4. Subsequently, either dry etching or wet etching is carried out on the metal film, to form the gate electrode 5. Thereafter, impurities such as phosphorus and boron are introduced into the semiconductor layer 2 by ion implantation, ion doping, or like other techniques, and are activated through heat treatment or the like, to form the source/drain regions 2b. During introduction of the impurities into the semiconductor layer 2, the channel region 2a is formed in a portion of the semiconductor layer 2 which is present directly under the gate electrode 5 because the gate electrode 5 serves as a mask. In some cases, an impurity region which is of the same conductivity type as the source/drain regions 2b and has a relatively low impurity concentration is formed between the channel region 2a and each of the source/drain regions 2b. It is noted that as the side wall of the island-like semiconductor layer 2, in other words, a section of an edge portion of a single pattern of the semiconductor layer 2, is made substantially perpendicular to the insulating substrate 1, a thickness of the portion of the semiconductor layer 2 in which the channel region 2a is formed is uniform as appreciated from FIG. 2.

Then, the interlayer insulating film 9 is formed to cover the gate electrode 5 by a CVD process, for example, following known procedures. Subsequently, the contact hole 10 for establishing connection to the source/drain regions 2b is formed in the interlayer insulating film 9 and the gate insulating film 4, and a metal film (not illustrated) is formed. Thereafter, the signal line 11 connected to the source/drain regions 2b is formed by patterning the metal film, to complete the thin film transistor. It is possible to form a display device including an image displaying part in which a scanning signal line connected to the gate electrode 5 of the thin film transistor and an image signal line connected to the signal line 11 of the thin film transistor intersect with each other at right angles and are connected to each pixel. Further, the thin film transistor according to the first preferred embodiment can be used in a driving circuit for display of images.

C. Effects

FIG. 2 illustrates some of electric fields applied to the semiconductor layer 2 from the gate electrode 5 via the gate insulating film 4. Among the electric fields applied to the semiconductor layer 2, an electric field applied perpendicularly to the semiconductor layer 2 is denoted as a reference numeral "E1", and an electric field applied diagonally to the semiconductor layer 2 is denoted as a reference numeral "E2" in FIG. 2.

As illustrated in FIG. 2, the thin film transistor according to the first preferred embodiment includes the insulating film 3. As such, the electric field E2 is applied to the semiconductor layer 2 via the insulating film 3. As a result, influences of the diagonally-applied electric field E2 on the edge portion of the semiconductor layer 2 can be weakened.

Also, in the thin film transistor according to the first preferred embodiment, because of inclusion of the insulating film 3, the gate insulating film 4 can be formed with a uniform thickness on the semiconductor layer 2 and the insulating film 3. As a result, influences of the electric field E2 applied to the edge portion of the semiconductor layer 2 via the gate insulating film 4 can be weakened.

If the insulating film 3 is not formed, only the gate insulating film 4 exists between the semiconductor layer 2 and the electric field E2 applied to the semiconductor layer 2. In such case, influences of the electric field E2 on the edge portion of the semiconductor layer 2 become significant.

Further, if the insulating film 3 is not formed, a portion of the gate insulating film 4 which is present on the side wall of the semiconductor layer 2 is thin because of poor step coverage thereof. Accordingly, influences of the electric field E2 on the edge portion of the semiconductor layer 2 become more significant.

As described above, if the insulating film 3 is not formed, the electric characteristics of the thin film transistor are probably degraded under influences of the electric field E2 applied to the edge portion of the semiconductor layer 2.

In the thin film transistor according to the first preferred embodiment, inclusion of the insulating film 3 allows for stabilization of the electric characteristics of the thin film transistor.

Additionally, to employ an SOG film as the insulating film 3 would further weaken influences of the electric field E2 on the edge portion of the semiconductor layer 2 because a dielectric constant of an SOG film can be easily reduced.

Figure 4:
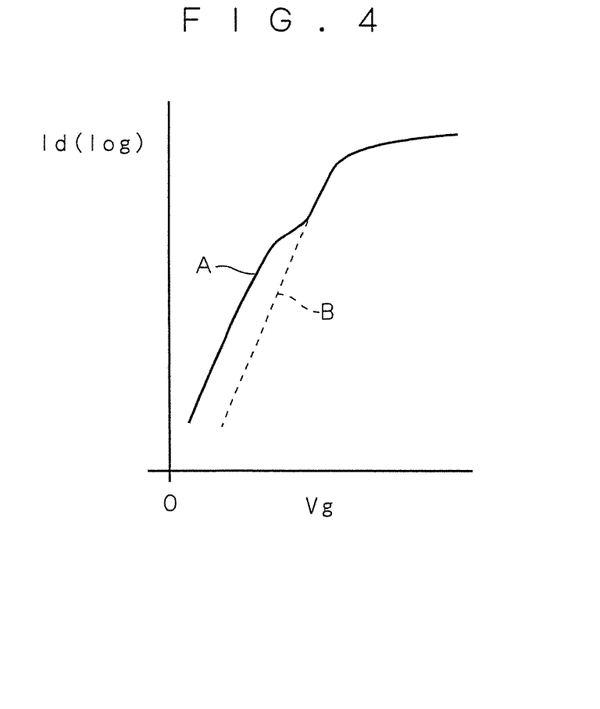
FIG. 4 is a graph showing electric characteristics of the thin film transistor according to the first preferred embodiment.

FIG. 4 is a graph showing the electric characteristics of the thin film transistor according to the first preferred embodiment. Specifically, the graph of FIG. 4 shows relationship of a drain current Id (vertical axis) to a gate voltage Vg (horizontal axis).

It is noted that a line A in the graph of FIG. 4 indicates electric characteristics of a thin film transistor in which the semiconductor layer 2 is tapered. In other words, the line A indicates electric characteristics of a thin film transistor in a case where the semiconductor layer 2 is formed to have a width which gradually decreases as a distance to a bottom increases.

On the other hand, a line B in the graph of FIG. 4 indicates the electric characteristics of the thin film transistor according to the first preferred embodiment.

As shown in FIG. 4, in the case where the semiconductor layer 2 is tapered, a hump occurs in the line indicating the electric characteristics of the thin film transistor because of inclusion of a portion thinner than the other portions in the semiconductor layer 2 (refer to the line A).

On the contrary, in the thin film transistor according to the first preferred embodiment, there is no need of tapering the semiconductor layer 2. Thus, the semiconductor layer 2 is formed with a uniform thickness. Accordingly, a hump can be lessened in the line indicating the electric characteristics of the thin film transistor (refer to the line B). As a result, variation in the threshold voltage Vth can be suppressed.

Also, the insulating film 3 is formed on the side wall of the semiconductor layer 2 in the thin film transistor according to the first preferred embodiment. Thus, the gate insulating film 4 can be formed on a stepped portion of the semiconductor layer 2 with good step coverage. As a result, the possibility of disconnection of the gate electrode 5 formed on the gate insulating film 4 is precluded.

It is additionally noted that though an SOG film is formed as the insulating film 3 in the thin film transistor according to the first preferred embodiment, the insulating film 3 does not necessarily include an SOG film and may include a TEOS film, a film formed by a CVD process, or the like, in the present invention.

Nevertheless, when an SOG film is employed as the insulating film 3, an insulating film in a desired shape can be easily formed along the side wall of the semiconductor layer 2 by carrying out heat treatment after the SOG film is spin coated.

Also, though the semiconductor layer 2 is formed directly on the insulating substrate 1 in the thin film transistor according to the first preferred embodiment, a protection film including a silicon nitride film, a silicon oxide film, or the like, may be formed on the insulating substrate 1. In such case, the semiconductor layer 2 is formed on the protection film.

A glass substrate contains an alkaline ion. As such, in a case where a glass substrate is employed as the insulating substrate 1, there is a possibility that an alkaline ion moves to be trapped into the semiconductor layer during manufacture of the thin film transistor or during operation of the thin film transistor. This increases a possibility that the electric characteristics of the thin film transistor become unstable.

By forming a protection film on a glass substrate, an alkaline ion is prevented from moving, to thereby stabilize the electric characteristics of the thin film transistor.

Second Preferred Embodiment

A. Structure

Figure 5:
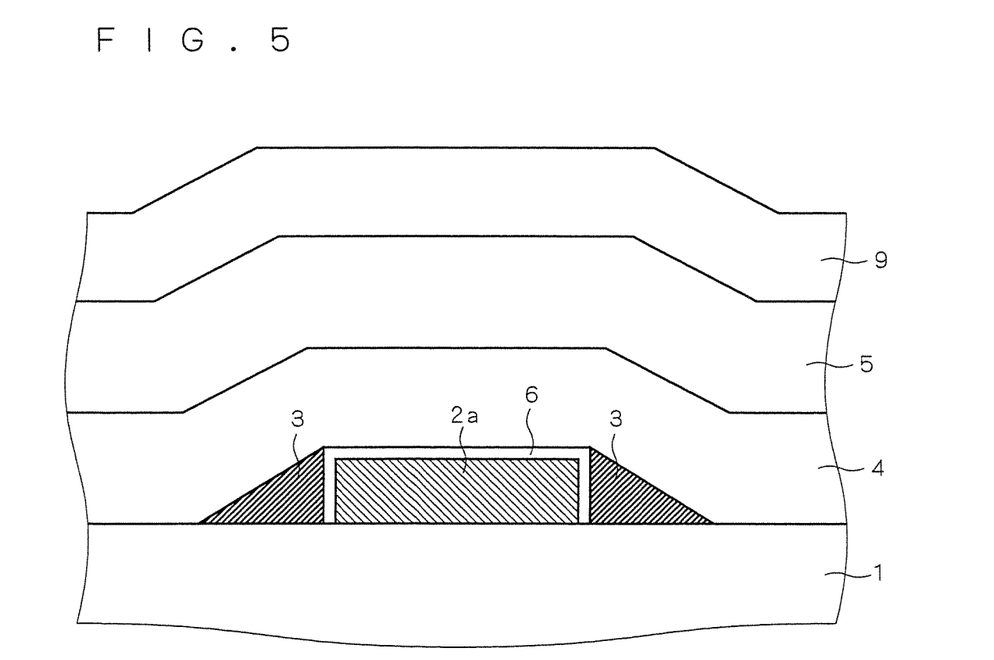
FIG. 5 is a sectional view illustrating a structure of a principal part of a thin film transistor according to a second preferred embodiment.

FIG. 5 is a sectional view illustrating a structure of a thin film transistor according to a second preferred embodiment. In the thin film transistor according to the second preferred embodiment, a protection film 6 including an oxide film is additionally formed to cover surfaces of the semiconductor layer 2 other than a surface opposing the insulating substrate 1.

The structure according to the second preferred embodiment is identical to that according to the first preferred embodiment in the other respects. The same elements are denoted by the same reference numerals in the structures according to the first and second preferred embodiments. Thus, in the second preferred embodiment, description of such elements, which would be the same as in the first preferred embodiment, is omitted.

B. Manufacturing Method

Next, a method of manufacturing the thin film transistor according to the second preferred embodiment will be described.

First, a semiconductor film is formed on an entire surface of the insulating substrate 1. Secondly, etching is carried out on the semiconductor film, to thereby form the island-like semiconductor layer 2.

For this etching, conditions for the etching are optimized so as to make the side wall of the semiconductor layer 2 substantially perpendicular to the insulating substrate 1.

Subsequently, the protection film 6 including an oxide film which is much thinner than the gate insulating film 4 is formed by oxidizing the surface of the substrate using a hydrogen peroxide solution, exposing the substrate to an atmosphere of oxygen plasma, or performing like other processes.

Thereafter, an SOG film is spin coated onto the insulating substrate 1. Then, heat treatment is carried out, so that the insulating film 3 which includes an SOG film and is tapered is formed along the side wall of the semiconductor layer 2.

After the insulating film 3 is formed, the gate insulating film 4 is formed to cover the semiconductor layer 2 and the insulating film 3 by a CVD process, or the like.

Steps which are to be performed after formation of the gate insulating film 4 in the manufacturing method according to the second preferred embodiment are identical to those in the manufacturing method according to the first preferred embodiment, and thus detailed description therefor is omitted.

C. Effects

The thin film transistor according to the second preferred embodiment produces the same effects as produced by the thin film transistor according to the first preferred embodiment. Further, in the thin film transistor according to the second preferred embodiment, the surfaces of the semiconductor layer 2 can be protected from an ambient atmosphere during formation of the gate insulating film 4 and the gate electrode 5 because the semiconductor layer 2 is covered by the protection film 6.

Third Preferred Embodiment

A. Structure

Figure 6:
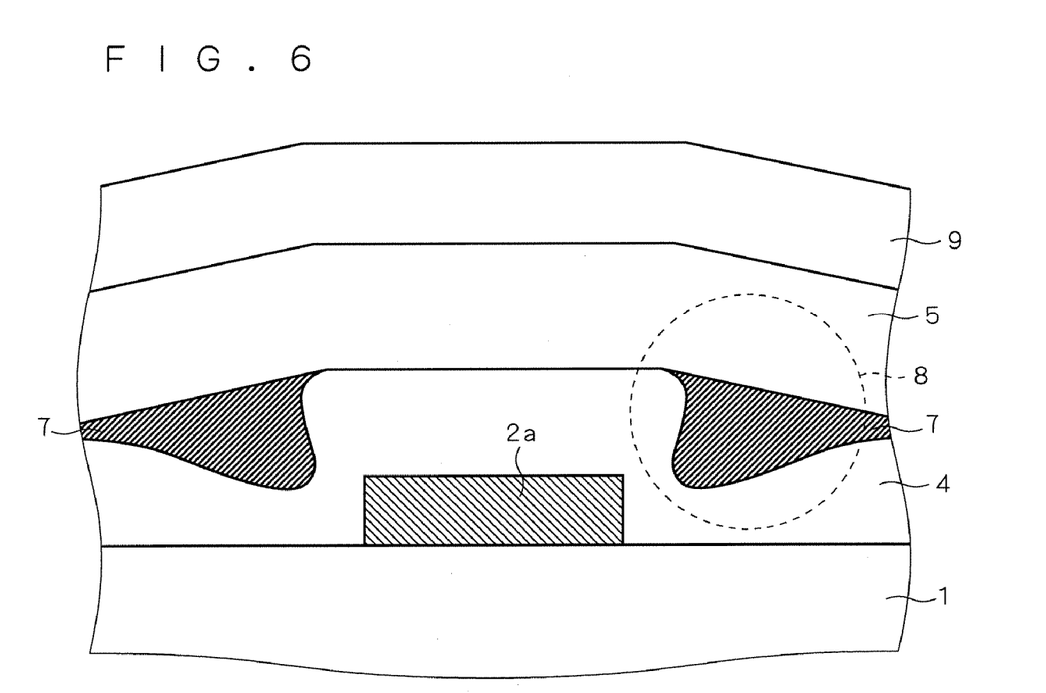
FIG. 6 is a sectional view illustrating a structure of a principal part of a thin film transistor according to a third preferred embodiment.

FIG. 6 is a sectional view illustrating a structure of a principal part of a thin film transistor according to a third preferred embodiment. In the thin film transistor according to the third preferred embodiment, the gate insulating film 4 is formed on the island-like semiconductor layer 2.

Further, an insulating film 7 including an SOG film is formed on the gate insulating film 4. The insulating film 7 is formed to fill a trench in the gate insulating film 4. The gate electrode 5 is formed on the gate insulating film 4 and the insulating film 7.

The structure according to the third preferred embodiment is identical to that according to the first preferred embodiment in the other respects. The same elements are denoted by the same reference numerals in the structures according to the first and third preferred embodiments. Thus, in the third preferred embodiment, description of such elements, which would be the same as in the first preferred embodiment, is omitted.

B. Manufacturing Method

Next, a method of manufacturing the thin film transistor according to the third preferred embodiment will be described. First, a semiconductor film is formed on an entire surface of the insulating substrate 1.

Secondly, etching is carried out on the semiconductor film, to thereby form the island-like semiconductor layer 2. For this etching, conditions for the etching are optimized so as to make the side wall of the semiconductor layer 2 substantially perpendicular to the insulating substrate 1.

Subsequently, the gate insulating film 4 is formed on the insulating substrate 1 by a CVD process or the like.

At that time, a trench 8 in a shape which causes the gate insulating film 4 to be shaped like eaves is formed in the gate insulating film 4 around the side wall of the semiconductor layer 2 because of poor coverage of the gate insulating film 4 over a stepped portion of the side wall of the semiconductor layer 2.

Then, an SOG film is spin coated onto the gate insulating film 4. Thereafter, heat treatment is carried out, so that the insulating film 7 is formed to fill the trench 8.

After the insulating film 7 is formed, a metal film (not illustrated) is formed on the gate insulating film 4. Subsequently, either dry etching or wet etching is carried out on the metal film, to form the gate electrode 5. Thereafter, impurities such as phosphorus and boron are introduced into the semiconductor layer 2 by ion implantation, ion doping, or like other techniques, and are activated through heat treatment or the like, to form the source/drain regions 2b. During introduction of the impurities into the semiconductor layer 2, the channel region 2a is formed in a portion of the semiconductor layer 2 which is present directly under the gate electrode 5 because the gate electrode 5 serves as a mask. In some cases, an impurity region which is of the same conductivity type as the source/drain regions 2b and has a relatively low impurity concentration is formed between the channel region 2a and each of the source/drain regions 2b. It is noted that as the side wall of the island-like semiconductor layer 2, in other words, a section of an edge portion of a single pattern of the semiconductor layer 2, is made substantially perpendicular to the insulating substrate 1, a thickness of the portion of the semiconductor layer 2 in which the channel region 2a is formed is uniform as appreciated from FIG. 6.

Then, the interlayer insulating film 9 is formed to cover the gate electrode 5 by a CVD process, for example, following known procedures. Subsequently, the contact hole 10 for establishing connection to the source/drain regions 2b is formed in the interlayer insulating film 9 and the gate insulating film 4, and a metal film (not illustrated) is formed. Thereafter, the signal line 11 connected to the source/drain regions 2b is formed by patterning the metal film, to complete the thin film transistor. It is possible to form a display device including an image displaying part in which a scanning signal line connected to the gate electrode 5 of the thin film transistor and an image signal line connected to the signal line 11 of the thin film transistor intersect with each other at right angles and are connected to each pixel. Further, the thin film transistor according to the third preferred embodiment can be used in a driving circuit for display of images.

C. Effects

In the thin film transistor according to the third preferred embodiment, the insulating film 7 is formed to fill the trench 8 in the gate insulating film 4. This smoothens an upper portion of the gate insulating film 4. As a result, the gate electrode 5 can be formed on the gate insulating film 4 without causing disconnection. Also, there is no need of tapering the semiconductor layer 2, so that the semiconductor layer 2 is formed with a uniform thickness. As the semiconductor layer 2 does not include a portion thinner than the other portions, it is possible to obtain a thin film transistor having excellent electric characteristics indicated by a line free from a hump.

Additionally, the insulating film 7 may include a film other than an SOG film. Nevertheless, when an SOG film is employed as the insulating film 7, it is possible to easily fill the trench 8 in the gate insulating film 4 by carrying out heat treatment after the SOG film is spin coated.

While the invention has been shown and described in detail, the foregoing description is in all aspects illustrative and not restrictive. It is therefore understood that numerous modifications and variations can be devised without departing from the scope of the invention.

What is claimed is:

1. A thin film transistor comprising;
    a semiconductor layer formed like an island on an insulating substrate and having a side wall substantially perpendicular to said insulating substrate;
    a gate insulating film formed on said semiconductor layer and along said side wall of said semiconductor layer;
    a gate electrode formed on said gate insulating film; and
    a trench-filling insulating film different from said gate insulating film and formed to fill a trench in said gate insulating film, said trench being formed due to a stepped portion in said side wall of said semiconductor layer, wherein
    said gate electrode is formed on both said trench-filling insulating film and said gate insulating film, and
    said gate electrode includes a portion extending over said trench-filling insulating film, said portion being slanted toward said insulating substrate.

2. A method of manufacturing a thin film transistor, said transistor comprising:
    a semiconductor layer formed like an island on an insulating substrate;
    a gate insulating film formed on said semiconductor layer;
    a gate electrode formed on said gate insulating film; and
    an insulating film formed to fill a trench in said gate insulating film, said trench being formed due to a stepped portion in a side wall of said semiconductor layer,
    said method comprising the steps of:
    (a) forming said island-like semiconductor layer on said insulating substrate;
    (b) forming said gate insulating film which covers said semiconductor layer; and
    (c) spin coating said insulating film onto said gate insulating film, to form said insulating film which fills said trench in said gate insulating film, said trench being formed due to said stepped portion in said side wall of said semiconductor layer.

3. The method of manufacturing a thin film transistor according to claim 2, wherein
    said step (c) includes a step of spin coating an SOG film onto said insulating substrate, to form said insulating film.

* * * * *